United States Patent
Li et al.

(10) Patent No.: US 10,513,792 B2
(45) Date of Patent: Dec. 24, 2019

(54) METHODS OF PHOSPHIDATION AND STRUCTURES MADE THEREFROM

(71) Applicant: KING ABDULLAH UNIVERSITY OF SCIENCE AND TECHNOLOGY, Thuwal (SA)

(72) Inventors: Lain-Jong Li, Thuwal (SA); Xiulin Yang, Thuwal (SA); Ang-Yu Lu, Thuwal (SA)

(73) Assignee: KING ABUDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 10 days.

(21) Appl. No.: 15/551,107

(22) PCT Filed: Feb. 12, 2016

(86) PCT No.: PCT/IB2016/050767
§ 371 (c)(1),
(2) Date: Aug. 15, 2017

(87) PCT Pub. No.: WO2016/132261
PCT Pub. Date: Aug. 25, 2016

(65) Prior Publication Data
US 2018/0080136 A1    Mar. 22, 2018

Related U.S. Application Data

(60) Provisional application No. 62/116,715, filed on Feb. 16, 2015.

(51) Int. Cl.
   *C25D 3/20*    (2006.01)
   *C25D 5/50*    (2006.01)
   *C25D 5/54*    (2006.01)
   *C25D 11/18*   (2006.01)
   *C25D 11/36*   (2006.01)
   (Continued)

(52) U.S. Cl.
   CPC ............. *C25D 5/50* (2013.01); *C23C 16/46* (2013.01); *C25B 1/04* (2013.01); *C25D 3/20* (2013.01); *C25D 5/48* (2013.01); *C25D 5/54* (2013.01); *C25D 11/18* (2013.01); *C25D 11/36* (2013.01); *Y02E 60/366* (2013.01)

(58) Field of Classification Search
   CPC ................................ C25D 5/48; C25D 5/50
   USPC ............................... 205/50, 66, 60
   See application file for complete search history.

(56) References Cited

U.S. PATENT DOCUMENTS

| | | | |
|---|---|---|---|
| 2010/0092865 A1 | 4/2010 | Kanno et al. | |
| 2010/0140097 A1* | 6/2010 | Wei | H01M 4/90 205/50 |
| 2014/0057127 A1* | 2/2014 | Kroener | C25D 5/12 428/614 |

FOREIGN PATENT DOCUMENTS

IL    39659 A    8/1975

OTHER PUBLICATIONS

Callejas, J., et al., "Electrocatalytic and Photocatalytic Hydrogen Production from Acidic and Neutral-pH Aqueous Solutions Using Iron Phosphide Nanoparticles", ACS NANO, Nov. 25, 2014, pp. 11101-11107, vol. 8, No. 11, American Chemical Society, US.
(Continued)

*Primary Examiner* — Brian W Cohen
(74) *Attorney, Agent, or Firm* — Billion & Armitage; Lisbeth C. Robinson

(57) ABSTRACT

The present disclosure provides for methods of phosphidation, catalysts formed from phosphidation, and methods of producing $H_2$.

5 Claims, 10 Drawing Sheets

(51) Int. Cl.
C25D 5/48 (2006.01)
C23C 16/46 (2006.01)
C25B 1/04 (2006.01)

(56) References Cited

OTHER PUBLICATIONS

Jiang, P., et al., "A Cost-Effective 3D Hydrogen Evolution Cathode with High Catalytic Activity: FeP Nanowire Array as the Active Phase**", Angewandte Chemie International Edition, Sep. 24, 2014, pp. 12855-12859, vol. 53, No. 47, Wiley-VCH Verlag GmbH & Co. KGaA, Weinheim.
Jiang, P., et al., "Suporting Information for a Cost-Effective 3D Hydrogen Evolution Cathode with High Catalytic Activity: FeP Nanowire Array as the Active Phase**", Angewandte Chemie International Edition, Sep. 24, 2014, pp. 12855-12859, vol. 53, No. 47, Wiley-VCH Verlag GmbH & Co. KGaA, Weinheim.
Tian, J., et al., "Self-Supported Nanoporous Cobalt Phosphide Nanowire Arrays: An Efficient 3D Hydrogen-Evolving cathode over the Wide Range of pH 0-14", Journal of the American Chemical Society, May 28, 2014, pp. 1587-7590, vol. 136, No. 21, ACS Publications.
Callejas, et al., "Electrocatalytic and Photocatalytic Hydrogen Production from Acidic and Neutral-pH Aqueous Solutions Using Iron Phosphide Nanoparticles", ACS Nano, 2014, 11101-11107.
Chen, et al., "Highly active and durable nanostructured molybdenum carbide electrocatalysts for hydrogen production", Energy & Environmental Science, 2013, 943-951.
Desheng, et al., "First-row transition metal dichalcogenide catalysts for hydrogen evolution reaction", RSC Publishing; Energy & Environmental Science, 2013, 3553-3558.
Faber, et al., "Earth-abundant inorganic electrocatalysts and their nanostructures for energy conversion applications", Royal Society of Chemistry, Energy & Environmental Science, 2014, 3519-3542.
Gengzhi, et al., "Fabrication of Ultralong Hybrid Microfibers from Nanosheets of Reduced Graphene Oxide and Transition-Metal Dichalcogenides and their Application as Supercapacitors", Angewandte Communications, Angew. Chem. Int. Ed., 2014, 12576-12580.
Green, et al., "Determination of the Platinum and Ruthenium Surface Areas in Platinum-Ruthenium Alloy Electrocatalysts by Underpotential Deposition of Copper. I. Unsupported Catalysts", J. Phys. Chem. B, 2002, 1036-1047.
Heron, et al., "Molybdenum Boride and Carbide Catalyze Hydrogen Evolution in both Acidic and Basic Solutions", Angew Chem., 2012, 12875-12878.
Huang, et al., "Ni12P5 Nanoparticles as an Efficient Catalyst for Hydrogen Generation via Electrolysis and Photoelectrolysis", ACS Nano, 2014, 8121-8129.
Huanga, et al., "One-pot synthesis of diiron phosphide/ nitrogen-doped graphene nanocomposite for effective hydrogen generation", Nano Energy, 2015, 666-674.
Jiang, et al., "A Cost-Effective 3D Hydrogen Evolution Cathode with High Catalytic Activity: FeP Nanowire Array as the Active Phase", Angewandte International Edition Chemie, 2014, 12855-12859.
Jieun, et al., "Two-Dimensional Hybrid Nanosheets of Tungsten Disulfide and Reduced Graphene Oxide as Catalysts for Enhanced Hydrogen Evolution", Angew. Chem., 2013, 13996-13999.
Jingqi, et al., "FeP Nanoparticles Film Grown on Carbon Cloth: An Ultrahighly Active 3D Hydrogen Evolution Cathode in Both Acidic and Neutral Solutions", Applied Materials & Interfaces, 2014, 20579-20584.
Jingqi, et al., "Self-Supported Nanoporous Cobalt Phosphide Nanowire Arrays: An Efficient 3D Hydrogen-Evolving Cathode over the Wide Range of pH 0-14", Journal of the American Chemical Society, 2014, 7587-7590.
Jun, et al., "Synthesis of FeP2/C nanohybrids and their performance for hydrogen evolution reaction", Royal Society of Chemistry, Journal of Materials Chemistry A, 2015, 499-503.
Junze, et al., "One-pot Synthesis of CdS Nanocrystals Hybridized with Single-Layer Transition-Metal Dichalcogenide Nanosheets for Efficient Photocatalytic Hydrogen Evolution", Angew. Chem., 2015, 1226-1230.
Liao, et al., "A nanoporous molybdenum carbide nanowire as an electrocatalyst for hydrogen evolution reaction", Energy & Environmental Science, 2014, 387-392.
Ligang, et al., "Easily-prepared dinickel phosphide (Ni2P) nanoparticles as an efficient and robust electrocatalyst for hydrogen evolution†", Royal Society of Chemistry, 2014, 5917-5921.
Liu, et al., "Carbon Nanotubes Decorated with CoP Nanocrystals: A Highly Active Non-Noble-Metal Nanohybrid for Electrocatalyst Hydrogen Evolution", Angewandte Communications, 2014, 6710-6714.
Lukowski, et al., "Enhanced Hydrogen Evolution Catalysis from Chemically Exfoliated Metallic MoS2 Nanosheets", Journal of the American Chemical Society, 2013, 10274-10277.
Nawal, et al., "Molybdenum carbide-carbon nanocomposites synthesized from a reactive template for electrochemical hydrogen evolution", Royal Society of Chemistry, 2014, 10548-10556.
Popczun, et al., "Highly Active Electrocatalysis of the Hydrogen Evolution Reaction by Cobalt Phosphide Nanoparticles", Angew. Chem. Int. Ed., 2014, 5427-5430.
Popczun, et al., "Nanostructured Nickel Phosphide as an Electrocatalyst for the Hydrogen Evolution Reaction", Journal of the American Chemical Society, 2013, 9267-9270.
Rongwei, et al., "Controlled synthesis of FeP nanorod arrays as highly efficient hydrogen evolution cathode", Royal Society of Chemistry; Journal of Materials Chemistry A, 2014, 17263-17267.
Smith, et al., "Molybdenum Sulfide Supported on Crumpled Graphene Balls for Electrocatalytic Hydrogen Production", Advanced Energy Materials, 2014, 1-6.
Subbaraman, et al., "Enhancing Hydrogen Evolution Activity in Water Splitting by Tailoring Li+-Ni(OH)2-Pt Interfaces", Science, Dec. 2, 2011, 1256-1260.
Tzu-Yin, et al., "Comparative study on MoS2 and WS2 for electrocatalytic water splitting", International Journal of Hydrogen 38, 2013, 12302-12309.
Voiry, et al., "Enhanced catalytic activity in strained chemically exfoliated WS2 nanosheets for hydrogen evolution", nature materials, Sep. 2013, 850-855.
Wan, et al., "Multiple Phases of Molybdenum Carbide as Electrocatalysts for the Hydrogen Evolution Reaction", Angew Chem. Int. Ed., 2014, 6407-6410.
Wei-Fu, et al., "Hydrogen-Evolution Catalysts Based on Non-Noble Metal Nickel-Molybdenum Nitride Nanosheets", Angew Chem. Int. Ed., 2012, 6131-6135.
Wenchao, et al., "Correlating hydrogen oxidation and evolution activity on platinum at different pH with measured hydrogen binding energy", Macmillan Publishers Limited., 2015, 1-6.
Xiong, et al., "Ni-doped Mo2C nanowires supported on Ni foam as a binder-free electrode for enhancing the hydrogen evolution performance", Royal Society of Chemistry, 2015, 1863-1867.
Xu, et al., "Anion-exchange synthesis of nanoporous FeP nanosheets as electrocatalysts for hydrogen evolution reaction", Chem. Commun. „ 2013, 6656-6658.
Yang, et al., "Recent advances in layered transition metal dichalcogenides for hydrogen evolution reaction", Royal Society of Chemistry, Journal of Materials Chemistry A, 2014, 5979-5985.
Yanguang, et al., "MoS2 Nanoparticles Grown on Graphene: An Advanced Catalyst for the Hydrogen Evolution Reaction", Journal of the American Chemical Society, 2011, 7296-7299.
Yongwen, et al., "Monolayer MoS 2 Films Supported by 3D Nanoporous Metals for High-Efficiency Electrocatalytic Hydrogen Production", Advanced Materials, 2014, 8023-8028.
Yung-Huang, et al., "Highly Efficient Electrocatalytic Hydrogen Production by MoS x Grown on Graphene-Protected 3D Ni Foams", Advanced Materials, 2013, 756-760.
Yung-Huang, et al., "Three-Dimensional Molybdenum Sulfide Sponges for Electrocatalytic Water Splitting", Nano Small Micro, 2014, 895-900.

(56) References Cited

OTHER PUBLICATIONS

Zeng, et al., "Growth of noble metal nanoparticles on single-layer TiS2 and TaS2 nanosheets for hydrogen evolution reaction", Energy Environ. Sci., 2014, 797-803.
Zhang, "FeP nanoparticles grown on graphene sheets as highly active non-precious-metal electrocatalysts for hydrogen evolution reaction", Royal Society of Chemistry, 2014, 11554-11557.
Zhang, et al., "MoS2 nanosheet/Mo2C-embedded N-doped carbon nanotubes: synthesis and electrocatalytic hydrogen evolution performance", Journal of Materials Chemistry A, Nov. 28, 2014, 18715-18719.

* cited by examiner

METHODS OF PHOSPHIDATION AND STRUCTURES MADE THEREFROM

CROSS-REFERENCE TO RELATED APPLICATIONS

This application is the National Stage of International Application No. PCT/IB2016/050767, filed 12 Feb. 2016, which claims the benefit of and priority to U.S. application claims priority to U.S. Provisional Patent Application No. 62/116,715 entitled "METHODS OF PHOSPHIDATION AND STRUCTURES MADE THEREFROM", filed on Feb. 16, 2015, all of which are expressly incorporated by reference as if fully set forth herein in their entirety.

BACKGROUND

Hydrogen is a clean energy carrier for replacing petroleum fuels to relieve issues associated with global warming. Water splitting by eletrolyzer is one of the most promising and efficient methods to produce hydrogen on demand. Among many different cathode materials, pure Platinum (110) exhibits the highest efficiency in the hydrogen evolution reaction (HER), where its Tafel slope is as low as ~30 mV/dec. However, the high cost and limited source of Pt retards its large scale applications. Recent research efforts have focused on several more economical materials which may be suitable replacements for Pt cathodes, such as molybdenum sulfide, $Mo_2C$, MoB, MoN and metal phosphides. It is recently noted that the HER efficiency of transition metal phosphides of Mo, W, Fe, Co and Ni have shown significant advances. The content for Fe, Ni, Co, Mo and Pt in the Earth's crust is estimated to be 50000, 80, 20, 1.5 and 0.003 ppm respectively. It is apparent that Fe, the fourth most common element in the Earth's crust, is a very attractive material for large-scale catalysis. Hence, the possibility of using iron phosphide as a HER catalyst has been extensively studied. $FeP_2$ was obtained by the pyrolysis of ferrocene and red phosphorous. Nanoporous FeP nanosheets were prepared by ion-exchange synthesis using $Fe_{18}S_{25}$ and trioctyl-phosphine as sources. Alternatively, FeP nanoparticles were synthesized by gas phase phosphidation of $Fe_3O_4$ nanoparticles at 350° C. These reports have demonstrated a Tafel slope ranging from 59 to 67 mV/dec. Very recently, dense FeP nanowire array has been achieved by chemical phosphidation of the hydrothermally grown FeOOH nano array, where the Tafel slope of the system has been further lowered to 38 mV/dec.

SUMMARY

Embodiments of the present disclosure provide methods of phosphidation, a catalyst, methods of producing $H_2$, and the like.

An embodiment of the present disclosure includes a method of phosphidation, comprising: electroplating of a metal (M) on a substrate, converting the M to MOOH, M oxide, or a combination, and converting the MOOH and/or M oxide to nanocrystalline metal phosphide (MP). In an embodiment, the metal is selected from the group consisting of: Fe, Co, and Ni. In an embodiment, the metal phosphide is selected from the group consisting of: FeP, CoP, and NiP. In an embodiment, converting the M to MOOH, M oxide, or a combination includes converting M to MOOH and/or M oxide, where M on the substrate can be converted to MOOH or M oxide or where a portion of the M can be converted to MOOH and another portion can be converted into M oxide. In a particular embodiment, the metal phosphate has a rugae-like morphology. In an embodiment, the substrate is a carbon-based substrate. In a particular embodiment, the substrate is a carbon cloth.

An embodiment of the present disclosure includes a catalyst, comprising a nanocrystalline metal phosphide (MP) having a rugae-like morphology. In an embodiment, the nanocrystalline metal phosphide is selected from the group consisting of FeP, CoP, and NiP. In an embodiment, the nanocrystalline metal phosphide is FeP and has a HER performance having a Tafel slope of about 28 to 30, about 29, or about 29.4 mV/dec. In a particular embodiment, the active site density for FeP can be about 10 to 50 or more times higher than that of Pt foil. In an embodiment, the FeP is disposed on a carbon cloth.

An embodiment of the present disclosure includes a method of producing $H_2$, comprising exposing $H_2O$ to a catalyst and producing $H_2$.

Other compositions, apparatus, methods, features, and advantages will be or become apparent to one with skill in the art upon examination of the following drawings and detailed description. It is intended that all such additional compositions, apparatus, methods, features and advantages be included within this description, be within the scope of the present disclosure, and be protected by the accompanying claims.

BRIEF DESCRIPTION OF THE DRAWINGS

FIG. 3a shows the polarization curves for the catalysts prepared at different phosphidation temperatures, where the current is normalized by the geometrical area of carbon cloth and the potential is after internal resistance correction. FIG. 3B are Tafel slopes extracted from the polarization curves in FIG. 1A. FIG. 3C shows double-layer capacitance for the corresponding catalysts prepared at different phosphidation temperatures. FIG. 3D shows time-dependent HER performance for the FeP phosphidated at 300° C.

DETAILED DESCRIPTION

Figure 1A:
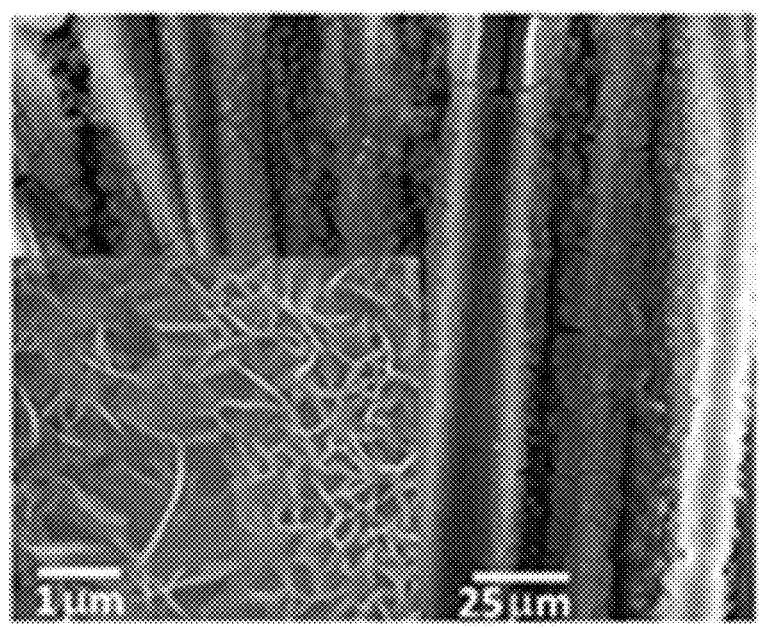
FIG. 1A is an SEM image for the FeOOH formed after oxidation of the electroplated Fe on carbon cloth.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, catalysis, material science, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Definitions

Phosphidation, as used herein, is a process of synthesizing transition metal phosphides (MP) using heat and/or electrochemical techniques and a reagent.

Hydrogen evolution reaction (HER), as used herein, is the process of producing hydrogen ions via water electrolysis.

General Discussion

Embodiments of the present disclosure provide for methods of phosphidation, catalysts formed from phosphidation, methods of producing $H_2$, and the like. Embodiments of the present disclosure may be advantageous since the catalyst formed has a relatively large surface area, has a Tafel slope that of about 28 to 30 mV/dec (e.g., better than that of Pt foil), and the active site density for the FeP described herein can be about 10 to 50 times or more higher than the Pt foil.

In an embodiment, the method of phosphidation includes electroplating of a metal (M) on a substrate. In an embodiment, the metal can include Fe, Co, or Ni. In an embodiment, the substrate can be a carbon-based substrate such as a carbon cloth. The metal can then be converted into MOOH and/or M oxide (either or a mixture can be present), which can have a rugae-like morphology. Subsequently, the MOOH and/or M oxide is converted into a nanocrystalline metal phosphide (MP), which can have a rugae-like morphology. In an embodiment, the MP can be FeP, CoP, or NiP.

In a particular embodiment, the method of phosphidation includes electroplating of Fe onto a substrate. In an embodiment, the substrate can be a carbon-based substrate such as a carbon cloth. The Fe can then be converted into FeOOH and/or $Fe_2O_3$, which can have a rugae-like morphology. In a particular embodiment, the Fe is converted into FeOOH. Next the FeOOH and/or $Fe_2O_3$ can be converted into nanocrystalline FeP, which can have a rugae-like morphology.

In an embodiment, converting can include a vapor phase phosphidation that is carried on in a two-zone chemical vapor deposition (CVD) furnace. A compound such as $NaH_2PO_2$, or a result equivalent alternative, can be evaporated at about 250 to 350° C. or about 300° C. and brought to the FeOOH and/or $Fe_2O_3$ at the downstream site, which can be set at a desired reaction temperature (e.g., about 250-300° C.).

In a specific embodiment, iron phosphide can be synthesized by vapor phase phosphidation of the FeOOH obtained by electroplating. The rugae-like morphology formed during the electroplating provides a large surface area. The subsequent phosphidation at about 300° C. converts the FeOOH to nanocrystalline FeP while maintaining the rugae morphology. The Tafel slope reaches about 28 to 30, about 29, or about 29.4 mV/dec, which is better than that of Pt foil. The active site density for our FeP can be about 10 to 50 times or 50 times higher than the Pt foil, suggesting that the high HER performance for FeP is strongly related to its large number of active sites. Although not intending to be bound by theory, it is believed that the nanocrystalline structure and the rugae-like surface contribute to its high HER performance. Additional details are provided in Example 1.

In an embodiment, the catalyst can include a nanocrystalline metal phosphide (MP) having a rugae-like morphology. In an embodiment, the substrate can be a carbon-based substrate such as a carbon cloth. In an embodiment, the MP can be FeP, CoP, or NiP. In an embodiment, the MP is FeP, where FeP has a HER performance having a Tafel slope of about 29.4 mV/dec and has an active site density for FeP is 50 times higher than the Pt foil. Additional details and embodiments are provided in the following Example.

An embodiment of the present disclosure provides for a method of producing $H_2$. In general, the method includes exposing $H_2O$ to a catalyst such as those described herein, which can produce $H_2$.

EXAMPLES

Now having described the embodiments of the disclosure, in general, the examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Example 1

In this Example, we perform the electroplating of Fe on carbon cloth and convert it to FeOOH or $Fe_2O_3$ at various oxidation temperatures. Systematic gas phase phosphidation reveals that nanocrystalline FeP, rather than highly crystalline FeP and $FeP_2$, leads to the best HER performance (Tafel slope=29.4 mV/dec), which is comparable to that of Pt at low overpotential. The required overpotential to reach 10 mA/cm$^2$ is 39 mV, even lower than 46 mV of our best Pt foil. The Tafel slope we obtained is also the lowest among the reported for metal phosphides.

Figure 1B:
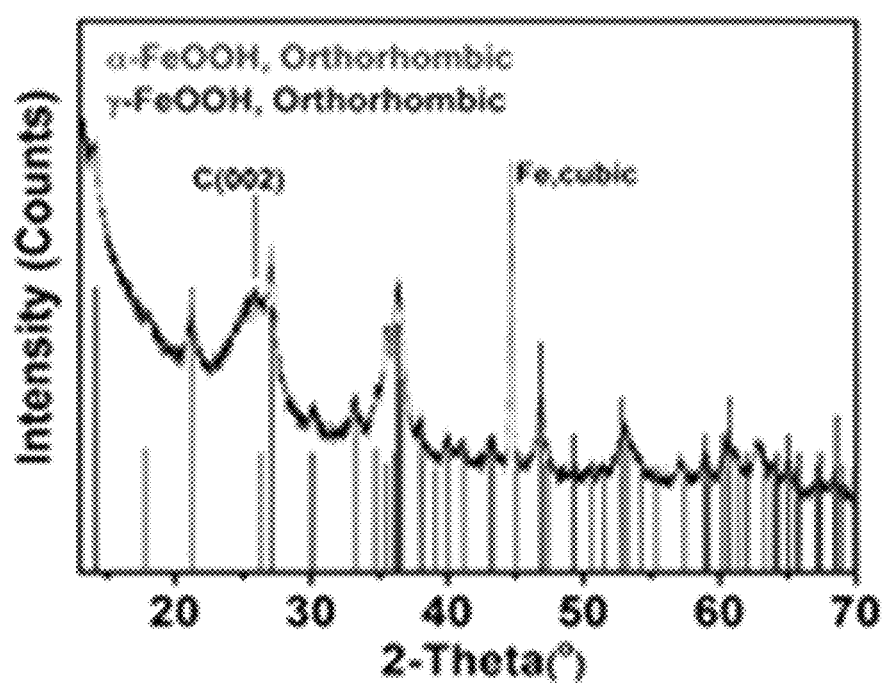
In FIG. 1B, the XRD pattern shows the presence of α- and γ-phase FeOOH as indexed.

The electroplating of Fe on carbon cloth is performed in a 0.1M FeSO$_4$ solution and the subsequent oxidation in air forms a uniform coating on the fibrous structure as shown in the scanning electron microscopy (SEM) images (FIG. 1A). The magnified SEM image reveals the rugae-like structure, which is beneficial for catalytic reaction owing to its high surface area. FIG. 1B displays the X-ray diffraction (XRD) pattern, which is well indexed to the polycrystalline α-and γ-FeOOH. The vapor phase phosphidation is carried on in a two-zone chemical vapor deposition (CVD) furnace, where the NaH$_2$PO$_2$ is evaporated at 300° C. and brought to the rugae-like FeOOH at the downstream site which can be set at a desired reaction temperature such as 250, 300, 400, and 500° C.

Figure 2A:
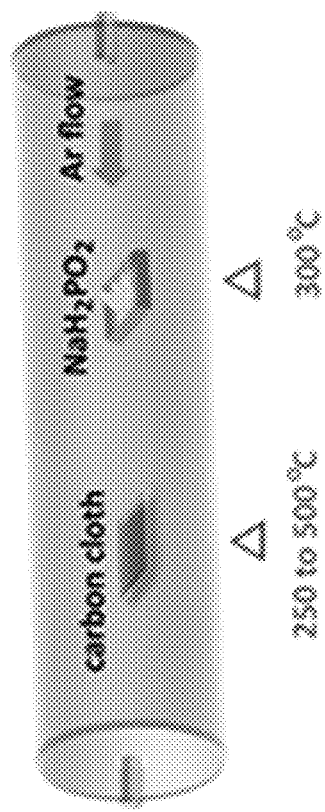
FIG. 2A is a schematic illustration for the phosphidation process.
Figure 2B:
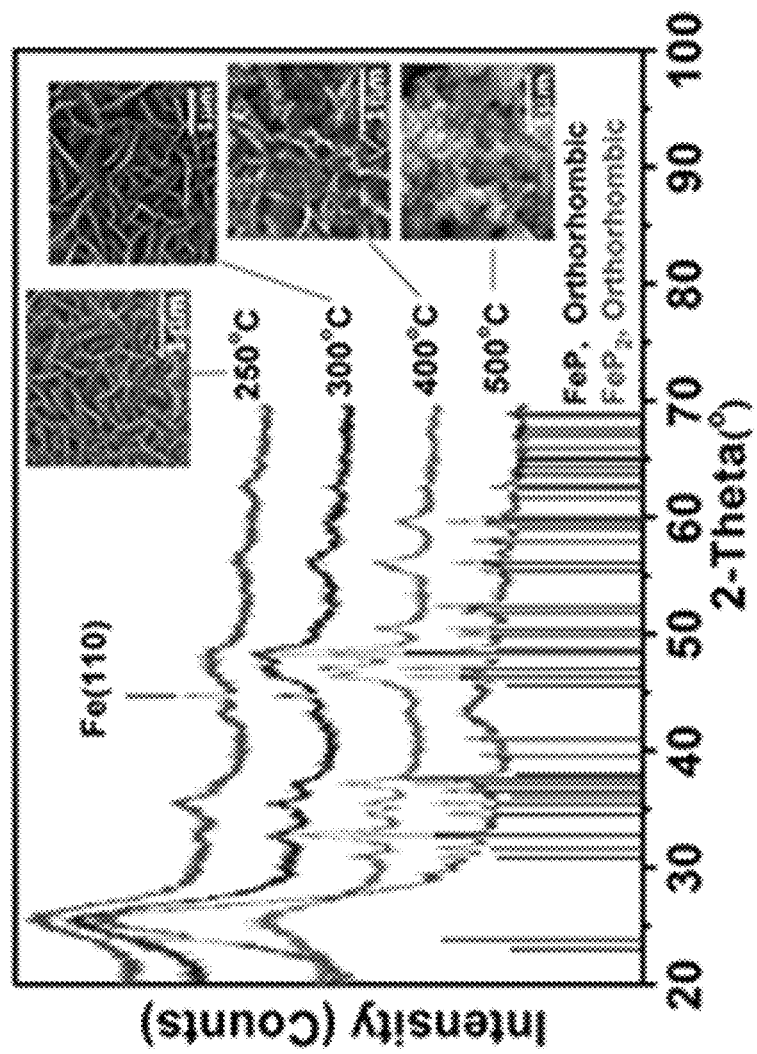
FIG. 2B shows XRD patterns and SEM images for the FeOOH/carbon cloth samples after phosphidation at varied temperatures.

FIG. 2A schematically illustrates the set-up for the gas phase phosphidation. We observe that the rugae-like FeOOH structures can be easily phosphidated with the vapor phase reaction at the temperature >250° C. The XRD results in FIG. 2B show that the orthorombic FeP crystals form after phosphidation at 400° C. and some FeP$_2$ also appears after 500° C. phosphidation. All peaks are well indexed to orthorombic FeP or FeP$_2$.[7g] When the phosphidation temperature is at 300° C. or lower, the diffraction peaks are relatively broader, suggesting that the resulted crystals are small in size. The SEM photos in inset of FIG. 2B show the surface morphology of the sample phosphidated at each temperature, where the rugae-like morphology still sustains after phosphidation at 250 or 300° C. A higher temperature such as 400 and 500° C. wrecks the rugae-like structures.

Figure 6:
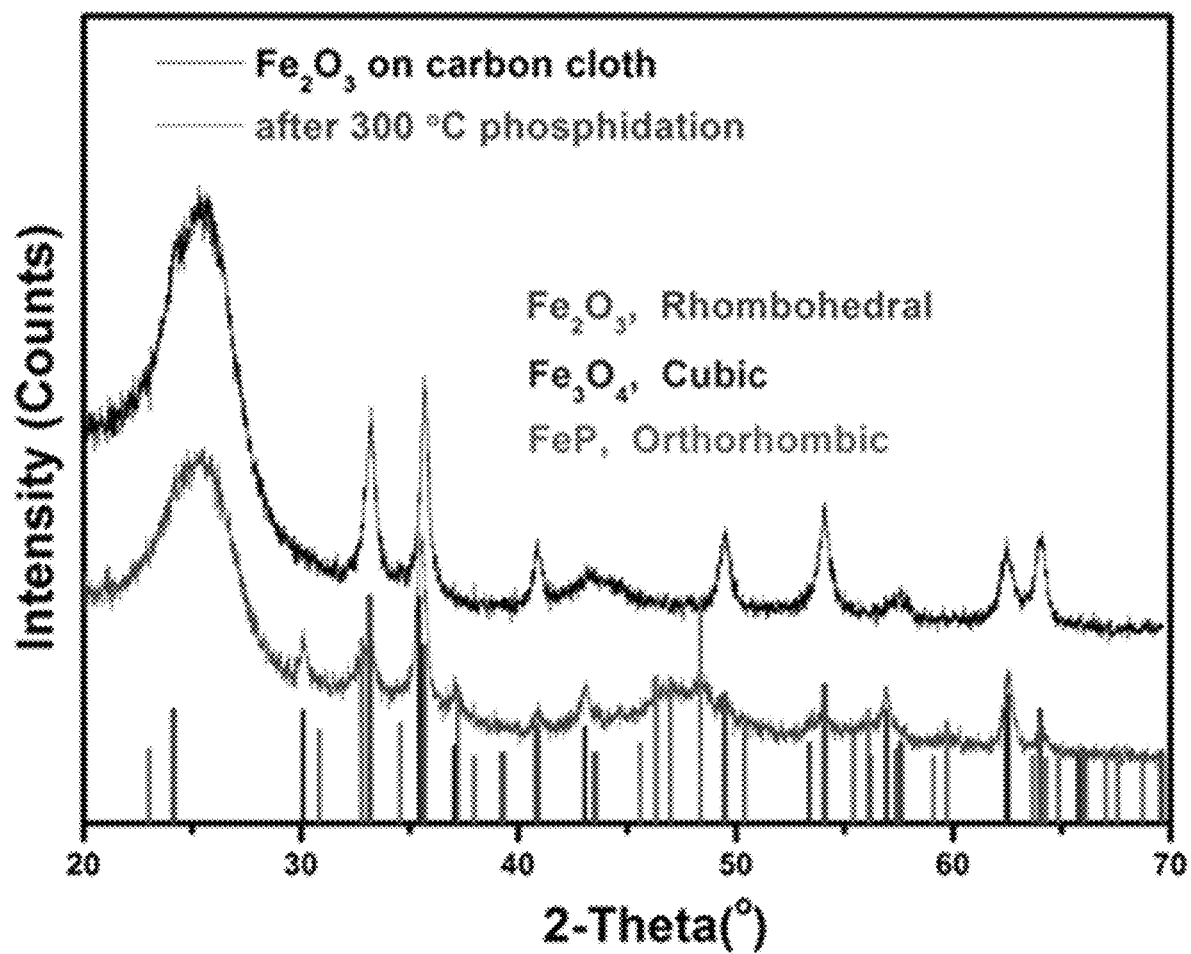
FIG. 6 is the XRD pattern of the $Fe_2O_3$ on carbon cloth obtained after heated at 400° C. in air for 4 h. The red curve is the XRD pattern for the sample after phosphidation at 300° C. for 1 h.
Figure 7A:
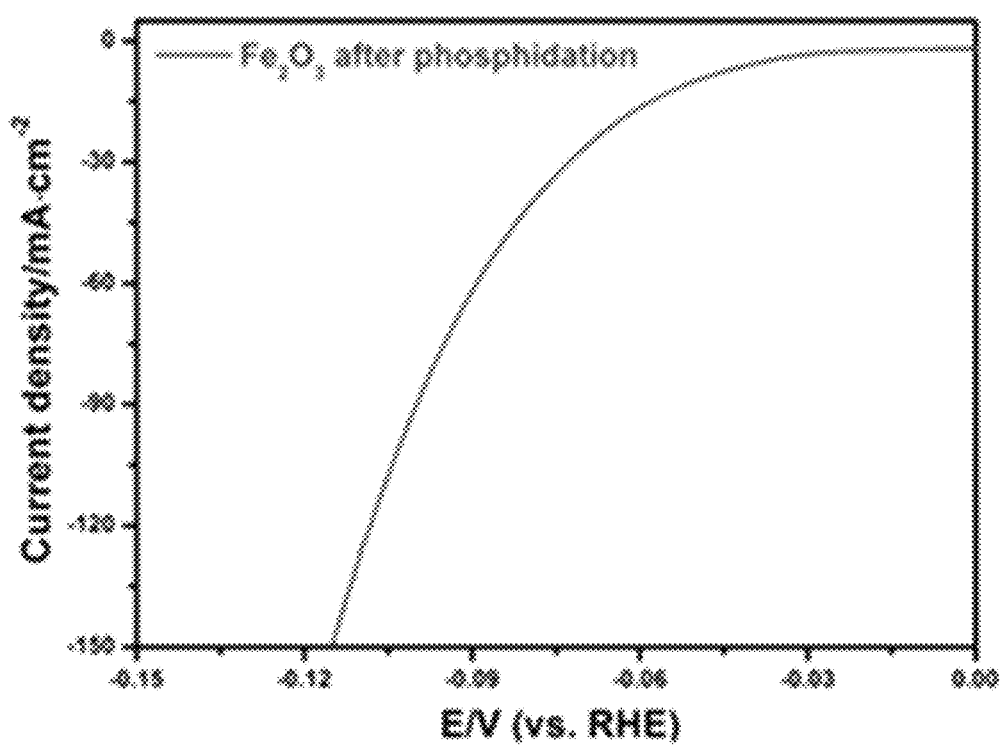
FIG. 7A shows the polarization curves for the $Fe_2O_3$ on carbon cloth after 300° C. phosphidation.
Figure 7B:
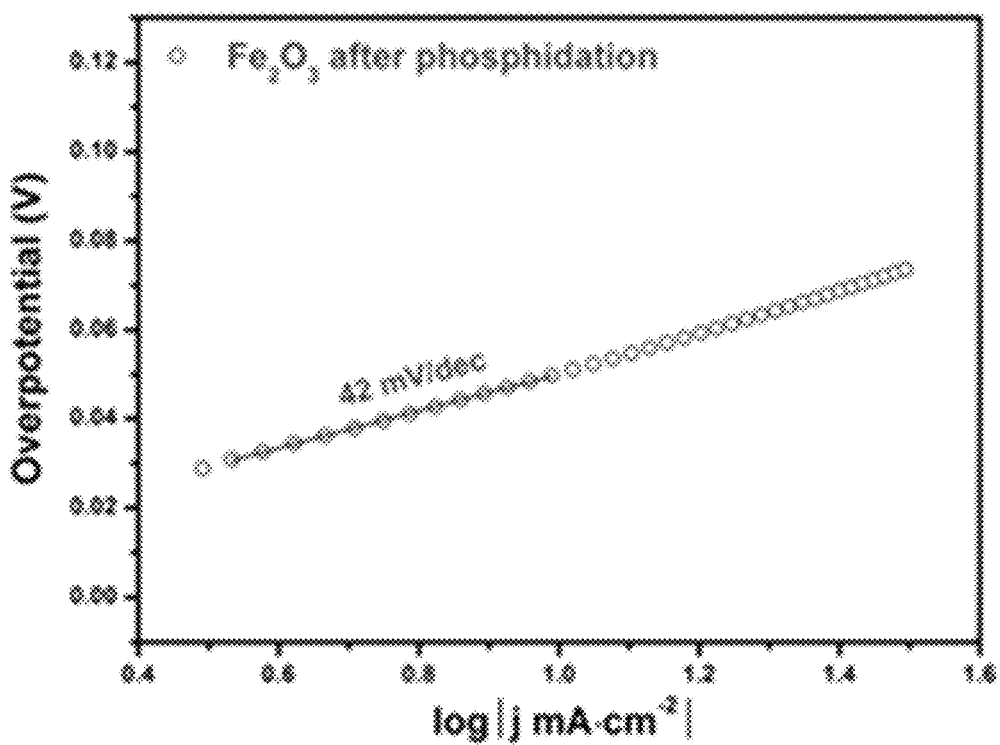
FIG. 7B demonstrates that the Tafel slope for the sample is 42 mV/dec.
Figure 8A:
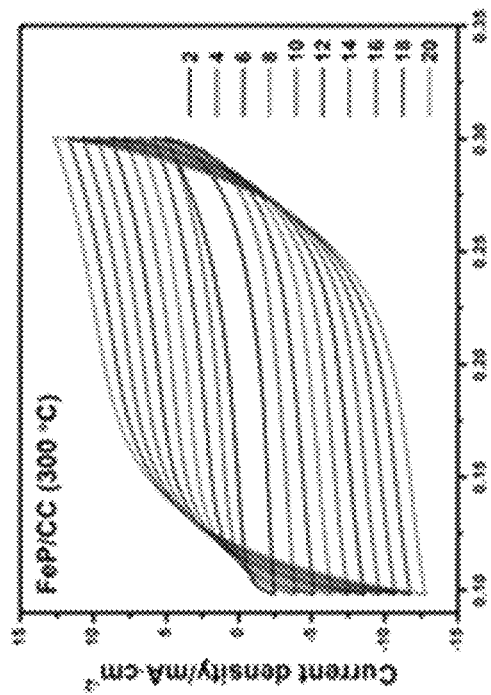
FIGS. 8A-D are cyclic voltammograms (CV) of FeP catalysts prepared at different phosphidation temperatures, where the curves are taken in a potential window without faradaic processes in a 0.5 M $H_2SO_4$.
Figure 8B:
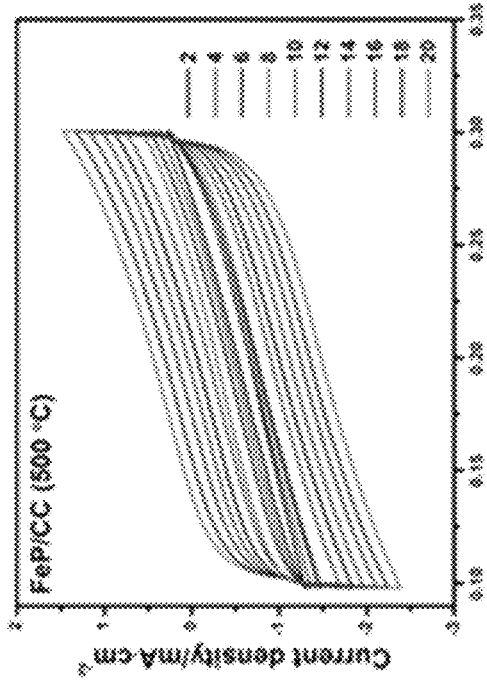
Figure 8C:
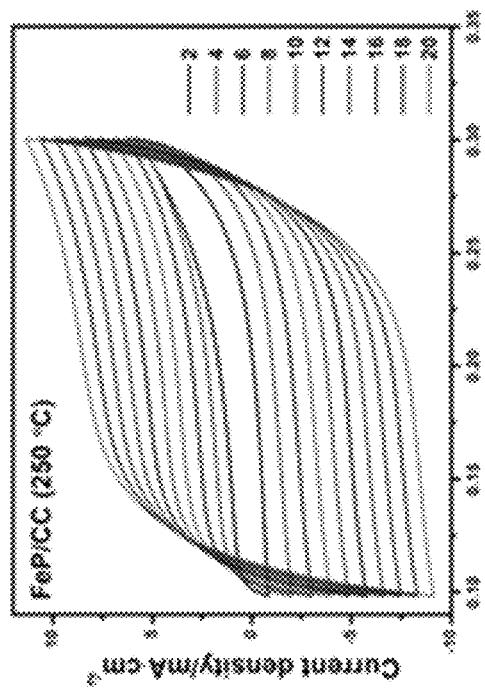
Figure 8D:
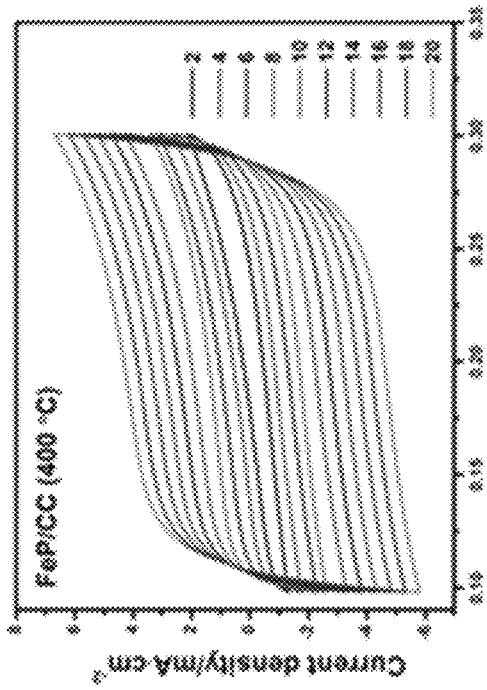

It is noted that the gas phase phosphidation of FeOOH is more efficient than Fe$_2$O$_3$. We have separately converted the electroplated Fe to Fe$_2$O$_3$ by heating the sample to 400° C. in air for 4 h. The subsequent phosphidation at 300° C. cannot efficiently convert Fe$_2$O$_3$ to FeP. The XRD result in supporting FIG. 6 demonstrates that Fe$_2$O$_3$ structure still remains and only part of the Fe$_2$O$_3$ is converted to Fe$_3$O$_4$ and FeP. The HER performance for the obtained catalyst is rather poor (Tafel slope is 42 mV/dec; Supporting FIGS. 7A-B) and thus we will focus our discussions on the catalysts prepared from FeOOH only.

Figure 3A:
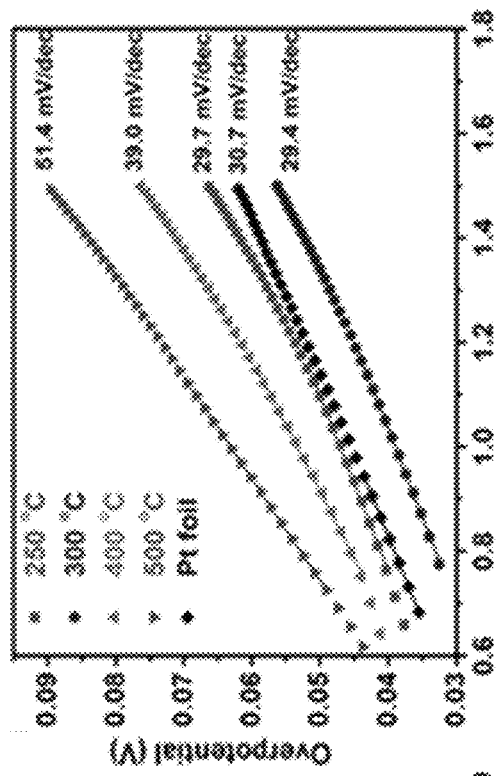
FIGS. 3A-D are graphs.
Figure 3B:
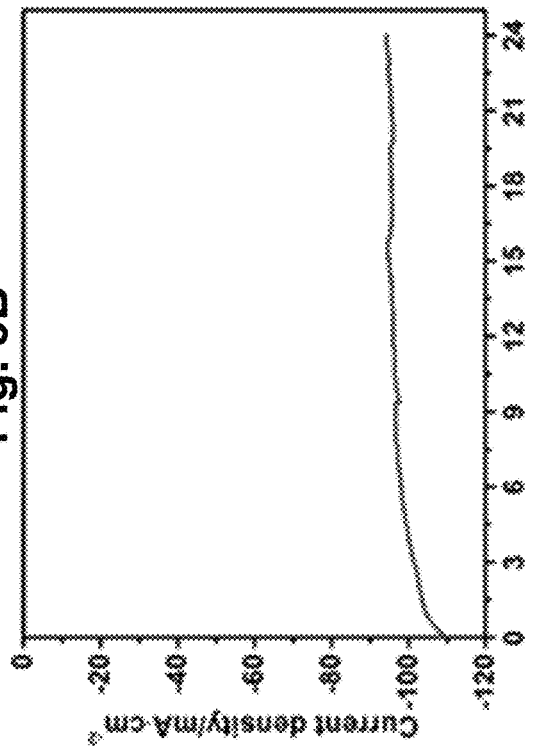
Figure 3C:
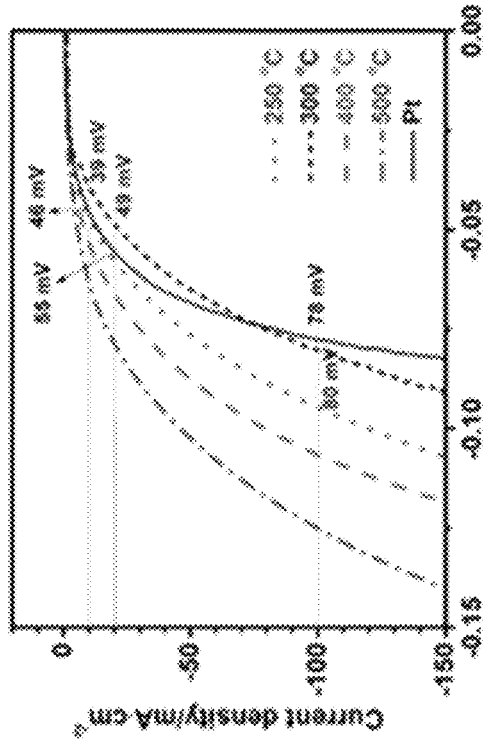
Figure 3D:
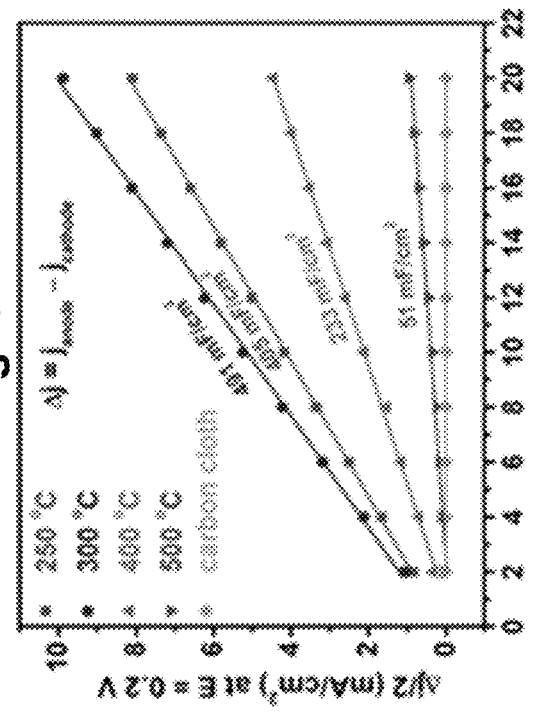
Figure 4:
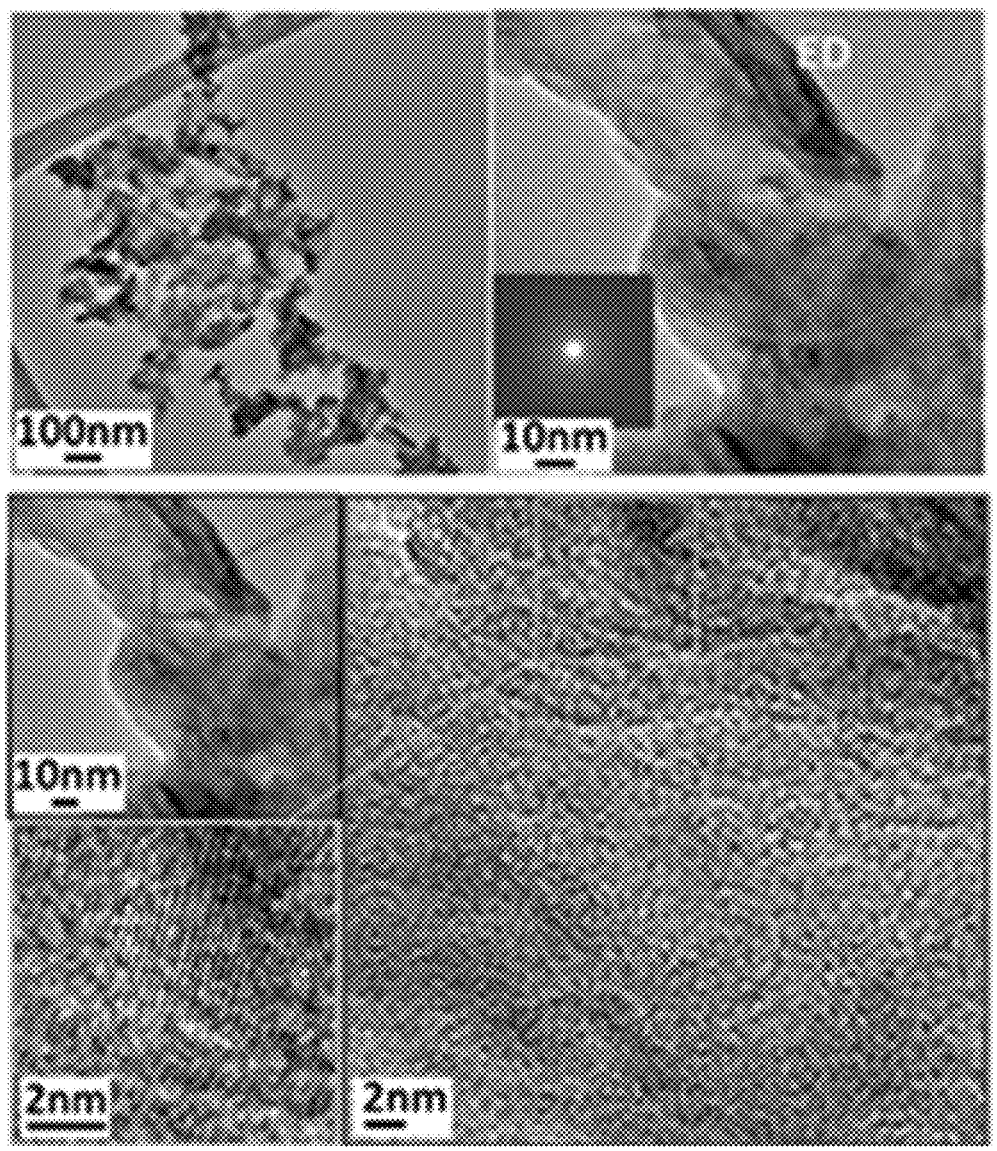
FIG. 4 is a collection of TEM images for the FeP catalyst phosphidated at 300° C.

FIG. 3A shows the polarization curves (measured current normalized by the geometrical area of the sample) for the catalysts prepared at different phosphidation temperatures. Note that the potential (V) used here is already after internal resistance compensation. Meanwhile, it is worthy that the RHE calibration is crucially important to ensure that the overpotential is correct (see experimental section for details). We observe that the HER current decreases with the increasing phosphidation temperature from 300 to 500° C., indicating that the highly crystalline FeP or FeP$_2$ is not necessarily better for HER. The Pt foil we used exhibits consistently good performance (overpotential of −46 mV, −55 mV and −78 mV vs. RHE at −10 mA/cm$^2$, −20 mA/cm$^2$ and −100 mA/cm$^2$ respectively). Interestingly, the corresponding overpotential for the catalyst phosphidated at 300° C. is −39 mV, −49 mV and −80 mV. The result is surprising since it is already superior to the performance of Pt at a low overpotential, a proper regime used to evaluate the intrinsic property of the HER catalysts. Nevertheless, the performance of Pt becomes better than FeP when the overpotential is larger than 75 mV. It is suspected that the transport of ionic species on ion phosphides may be limited, which requires further study. FIG. 3B shows that the Tafel slope for the sample prepared at 400° C. (FeP) and 500° C. (FeP+FeP$_2$) is 39.0 and 51.4 mV/dec respectively. Surprisingly, the Tafel slope for the samples phosphidated at 300° C. is around 29.4 mV/dec, which is comparable to that of Pt. Supporting Table S1 compiles the HER characteristics for the metal phosphides from existing reports, where our catalyst seems to possess superior performance. We perform the scanning rate measurement for these samples to extract their capacitance of the double layer at the solid-liquid interface (see supporting FIGS. 8A-D for details). FIG. 3C summarizes the obtained capacitance, from which we conclude that a lower Tafel slope correlates to a higher capacitance. This implies that the HER efficiency variation is related to the difference in capacitance. Note that the capacitance is a rather nice gauge for the interfacial area between the surface of the electrode and an electrolyte. In other words, the effective surface area of the catalysts based on highly crystalline FeP or FeP$_2$ is lower than the samples phosphidated at 300° C. The capacitance results are also in line with the SEM observation as shown in FIG. 2B. In addition to the high HER efficiency, the catalyst also presents excellent stability in acidic solutions as shown in the time dependent measurement (FIG. 3D). The transmission electron microscopy (TEM) images in FIG. 4 demonstrate that the sample phosphidated at 300° C. consists of rich FeP nanocrystallites with irregular shapes, where the crystallites are only few nanometer in lateral size. Electron diffraction (ED) tells that these crystallites are randomly oriented. It is likely that the high surface area from rugae-like morphology together with the large number of nanocrystallites contribute to the high performance HER.

Figure 5A:
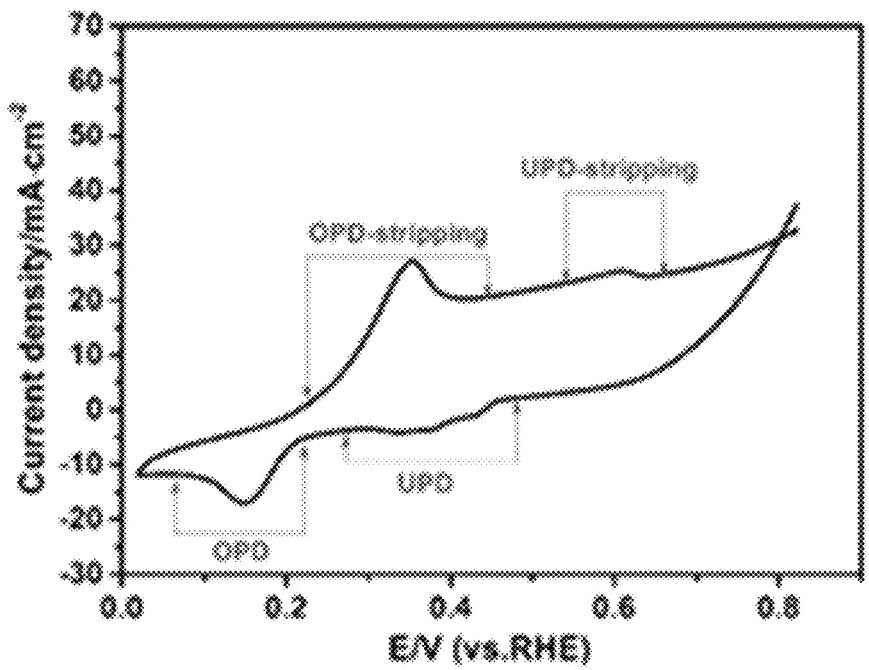
FIG. 5A illustrates the current-voltage scan for the FeP catalyst formed at 300° C. (Scan procedure: from positive to negative and then positive voltages). The electrochemical processes UPD, OPD, OPD-stripping and UPD-stripping are observed in sequence.
Figure 5B:
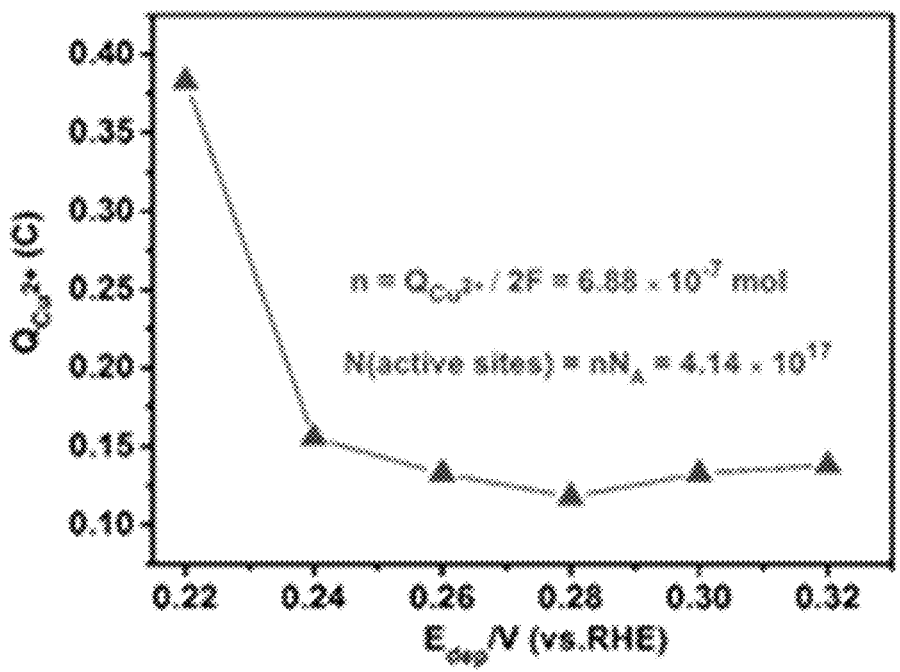
FIG. 5B illustrates charges required to strip the Cu deposited at different underpotentials.
Figure 9:
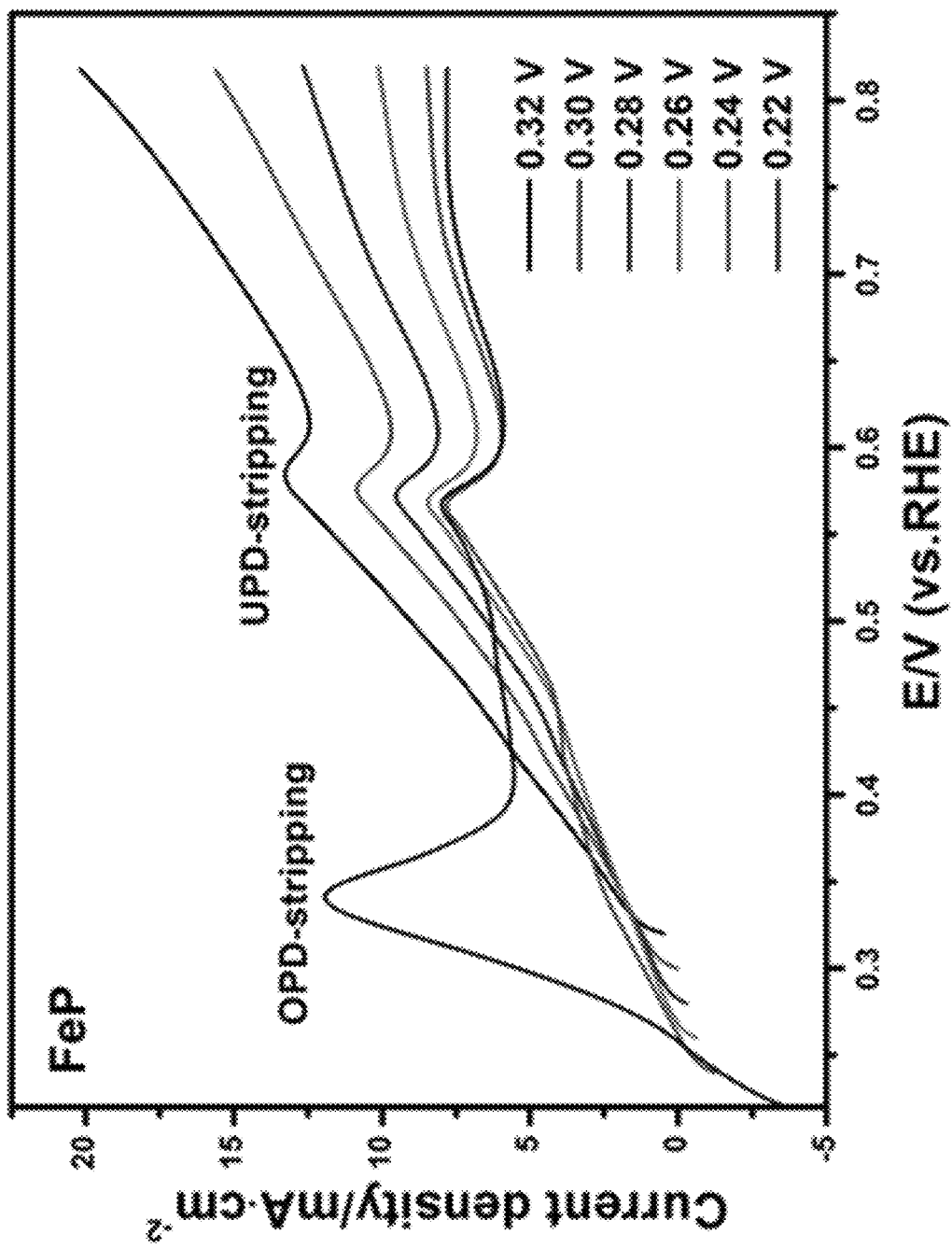
FIG. 9 graphs voltammetric scans. After the UPD of Cu on FeP catalysts at various underpotentials (0.22, 0.24, 0.26, 0.28, 0.30 and 0.32 V), linear voltammetric scans were then performed from the set underpotential to a point at which all of the UPD copper had been oxidized at a scan rate of 5 mV·s$^{-1}$. It is observed that curves for the UPD at 0.22V and 0.24V show an OPD-stripping peak, meaning that some overpotential-deposited Cu is involved. The curve for UPD at 0.26V is used to extract the charge quantity $Q_{Cu}^{2+}$.

The underpotential deposition (UPD) of copper has been used to extract the density of active sites for Pt[9] and $WS_2$,[10] where they observe that the coverage and surface density of the copper is the same as that for adsorbed hydrogen on the HER catalyst surface. Hence, the surface activity of HER catalysts can be determined by measuring the charges exchanged during the stripping of the copper deposited at the underpotential regions. The optimal condition for measuring active sites of our FeP is in a solution with 0.5 M $H_2SO_4$ and 20 mM $CuSO_4$. FIG. 5a displays the current-voltage scan for FeP formed at 300° C., where the regions for UPD, overpotential deposition (OPD) and their stripping are clearly observed. FIG. 5B shows the charges required to strip the Cu ($Q_{Cu2+}$) deposited at different underpotentials. We find that the $Q_{Cu2+}$ for the UPD at 0.22 and 0.24 V has already involved OPD of Cu (see FIG. 9 for details). The $Q_{Cu2+}$ plateau in between UPD 0.26V and 0.32V allows us to extract the active sites number. The $Q_{Cu2+}$ at UPD 0.26 V is 0.1328 C, meaning that $6.68 \times 10^{-7}$ mol of Cu (0.1328/96500/2) has been deposited. Since the electrode area of our FeP is 1 $cm^2$, the active site density is estimated as $6.68 \times 10^{-7}$ mol/$cm^2$=$4.14 \times 10^{17}$ sites/$cm^2$. Note that the active site density for the Pt foil estimated using the same method is $7.9 \times 10^{15}$ sites/$cm^2$, which is in the same order of magnitude as the number $1.5 \times 10^{15}$ sites/$cm^2$ reported elsewhere.[10]

In summary, iron phosphide was synthesized by vapor phase phosphidation of the FeOOH obtained by electroplating. The rugae-like morphology formed during the electroplating provides a large surface area. The subsequent phosphidation at 300° C. converts the FeOOH to nanocrystalline FeP while maintaining the rugae morphology. The Tafel slop reaches 29.4 mV/dec, better than that of Pt foil. The active site density for our FeP is 50 times higher than the Pt foil, suggesting that the high HER performance for FeP is strongly related to its large number of active sites. We believe the nanocrystalline structure and the rugae-like surface contribute to its high HER performance.

Experimental Section

Materials: All chemical reagents used in this experiment were of analytical grade. Ferrous sulfate heptahydrate ($FeSO_4 \cdot 7H_2O$), sodium hypophosphite ($NaH_2PO_2$), sodium hydroxide (NaOH), nitric acid ($HNO_3$), sulfuric acid ($H_2SO_4$) and ethanol were used as received without further purification. The water used throughout all experiments was purified through a Millipore system.

Synthesis of FeOOH on carbon cloth: The carbon cloth (CC, 1 cm×2.5 cm) was repeatedly washed using deionized water and ethanol to remove impurities and maintain the wettability of the CC. The CC was then quickly inserted into 0.1 M $FeSO_4$ (immersed geometric area 1 $cm^2$) as a working electrode. The 0.1 M $FeSO_4$ was prepared by dissolving 1.112 g (4 mmol) $FeSO_4 \cdot 7H_2O$ in 40 mL Milli-Q water at room temperature (~23° C.). Pt foil and Ag/AgCl (in 3 M KCl solution) electrode were used as the counter and reference electrodes, respectively. Constant current electroplating was conducted at −10 mA·$cm^{-2}$ in a PGSTAT 302N Autolab workstation. Freshly prepared samples were then exposed to air for overnight.

Preparation of FeP on carbon cloth: In a typical experiment, the $NaH_2PO_2$ in a porcelain boat was put in the upstream side and FeOOH/CC in another boat was placed at the downstream side in a furnace. First, the acquired samples were heated to different temperatures with a heating speed of 2° C./min in an Ar flowing atmosphere (60 sccm). Subsequently, the $NaH_2PO_2$ was quickly heated to the temperature of 260° C. in 10 min, and then slowly raised to 300° C. with a heating speed of 1° C./min to transport the generated $PH_3$ to the substrate. After the reaction, the samples were immersed into 0.5 M $H_2SO_4$ and Milli-Q water for 20 min respectively to dissolve the impurities. After dried in vacuum oven, the loading of FeP on CC was determined to be 4.9 mg·$cm^{-2}$ using a high precision microbalance.

Figure 10:
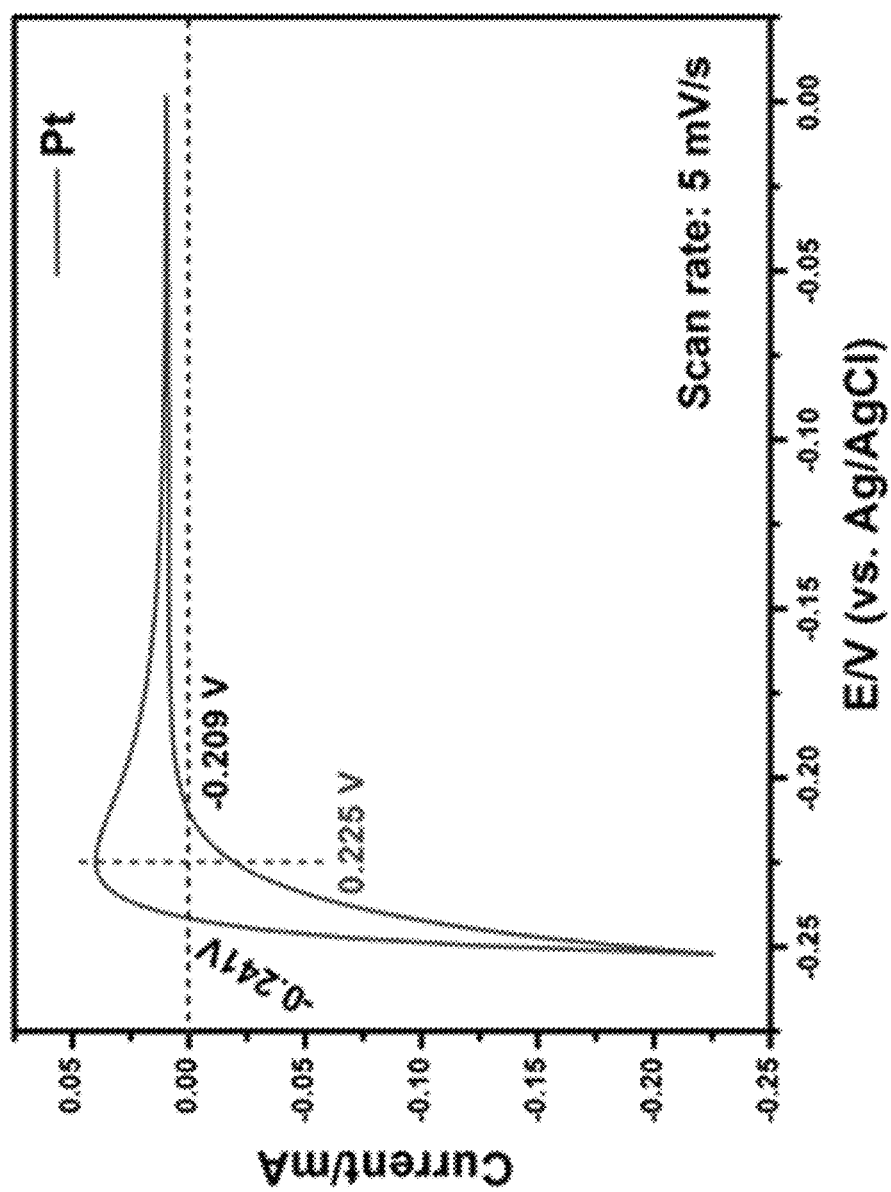
FIG. 10 demonstrates RHE voltage calibration. The calibration was performed in the high purity hydrogen saturated electrolyte with a Pt wire as the working electrode. The current-voltage scans were run at a scan rate of 5 mV·s$^{-1}$, and the average of the two potentials at which the current crossed zero was taken to be the thermodynamic potential for the hydrogen electrode reactions. Our result shows that the E(Ag/Ag/Cl) is lower than E(RHE) by 0.225V. This value is consistent with the value 0.218V from Nernst equation as described in experimental section.

Electrochemical Measurements: The electrochemical measurements were performed in a PGSTAT 302N Autolab Potentiostat/Galvanostat (Metrohm) at room temperature. Graphite rod and Ag/AgCl (in 3 M KCl solution) electrode were used as counter and reference electrodes, respectively. The reference electrode was calibrated for the reversible hydrogen potential in the electrolyte solution purged with Ar for 30 min prior to measurements. In a 0.5 M $H_2SO_4$ solution, E(RHE)=E(Ag/AgCl)+0.197+0.059 pH. The pH value for our solution is 0.35 and hence the equation becomes E(RHE)=E(Ag/AgCl)+0.218. The validity of the Nernst equation used in our study has been verified by our separate RHE calibration. The calibration was done in a high purity hydrogen saturated electrolyte with a Pt wire as the working electrode (see Supporting FIG. 10 for details), where the measurement (0.225 V offset) agrees well with the value 0.218V mentioned above.

The electrocatalytic activity of FeP towards HER was examined by obtaining polarization curves using linear sweep voltammetry (LSV) at a scan rate of 0.5 mV·$s^{-1}$ in 0.5 M $H_2SO_4$ solution. The time dependent current density of the FeP was tested in 0.5 M $H_2SO_4$ at an overpotential of 85 mV (vs. RHE). All data have been corrected for a small ohmic drop (~1.7Ω) based on impedance spectroscopy.

Estimation of Active Site Density: All copper UPD experiments were carried out in a 0.5 M $H_2SO_4$ and 20 mM $CuSO_4$ solution. After electrochemical cleaning in a $H_2SO_4$ solution, the FeP electrode was transferred into solution containing dissolved cupric ions and then polarized at various underpotentials (from 0.22 V to 0.32 V) for 120 s. A linear voltammetric scan was then performed from the set underpotential to a point at which all of the UPD copper had been oxidized at a scan rate of 5 mV·$s^{-1}$. Charges obtained for copper stripping were corrected by subtracting the charge obtained for the same electrode under the same conditions in the absence of any cupric ions in solution (i.e. 0.5 M $H_2SO_4$).

Characterization: The morphologies of the catalysts were determined by filed-emission scanning electron microscope (FESEM, FEI Quanta 600) and transmission electron microscopy (FEI Titan ST, operated at 300 KV). The crystalline structure of the samples was analyzed by X-ray diffraction (XRD, Bruker D8 Discover diffractometer, using Cu Kα radiation, λ=1.540598 Å).

REFERENCES

[1] a) Z. Zeng, C. Tan, X. Huang, S. Mao, H. Zhang, *Energy Environ. Sci.* 2014, 7, 797; b) J. Chen, X.-J. Wu, L. Yin, B. Li, X. Hong, Z. Fan, B. Chen, C. Xue, H. Zhang, Angew. Chem. Int. Ed. 2015, 54, 1210; c) J. Yang, D. Voiry, S. J. Ahn, D. Kang, A. Y. Kim, M. Chhowalla, H. S. Shin, Angew. Chem. Int. Ed. 2013, 52, 13751.

[2] a) W. Sheng, Z. Zhuang, M. Gao, J. Zheng, J. G. Chen, Y. Yan, Nat. Commun. 2015, 6, 5848; b) R. Subbaraman, D. Tripkovic, D. Strmcnik, K.-C. Chang, M. Uchimura, A. P. Paulikas, V. Stamenkovic, N. M. Markovic, Science 2011, 334, 1256.

[3] a) Y. Li, H. Wang, L. Xie, Y. Liang, G. Hong, H. Dai, J. Am. Chem. Soc. 2011, 133, 7296; b) M. A. Lukowski, A. S. Daniel, F. Meng, A. Forticaux, L. Li, S. Jin, J. Am. Chem. Soc. 2013, 135, 10274; c) Y. W. Tan, P. Liu, L. Y. Chen, W. T. Cong, Y. Ito, J. H. Han, X. W. Guo, Z. Tang, T. Fujita, A. Hirata, M. W. Chen, Adv. Mater. 2014, 26, 8023; d) Y.-H. Chang, C.-T. Lin, T.-Y. Chen, C.-L. Hsu, Y.-H. Lee, W. Zhang, K.-H. Wei, L.-J. Li, Adv. Mater. 2013, 25, 756; e) Y.-H. Chang, F.-Y. Wu, T.-Y. Chen, C.-L. Hsu, C.-H. Chen, F. Wiryo, K.-H. Wei, C.-Y. Chiang, L.-J. Li, Small 2014, 10, 895; f) A. J. Smith, Y.-H. Chang, K. Raidongia, T.-Y. Chen, L.-J. Li, J. Huang, Adv. Energy Mater. 2014, 4, 1400398; g) T.-Y. Chen, Y.-H. Chang, C.-L. Hsu, K.-H. Wei, C.-Y. Chiang, L.-J. Li, Int. J. Hydrogen Energy 2013, 38, 12302.

[4] a) K. Zhang, Y. Zhao, S. Zhang, H. Yu, Y. Chen, P. Gao, C. Zhu, J. Mater. Chem. A 2014, 2, 18715; b) K. Xiong, L. Li, l. Zhang, W. Ding, l. peng, Y. Wang, S. Chen, S. Tan, Z. Wei, J. Mater. Chem. A 2015, 3, 1863; c) L. Liao, S. Wang, J. Xiao, X. Bian, Y. Zhang, M. D. Scanlon, X. Hu, Y. Tang, B. Liu, H. H. Girault, Energy Environ. Sci. 2014, 7, 387; d) W. F. Chen, C. H. Wang, K. Sasaki, N. Marinkovic, W. Xu, J. T. Muckerman, Y. Zhu, R. R. Adzic, Energy Environ. Sci. 2013, 6, 943; e) C. Wan, Y. N. Regmi, B. M. Leonard, Angew. Chem. Int. Ed. 2014, 53, 6407; f) N. S. Alhajri, D. H. Anjum, K. Takanabe, J. Mater. Chem. A 2014, 2, 10548.

[5] H. Vrubel, X. Hu, Angew. Chem. Int. Ed. 2012, 124, 12875.

[6] a) W.-F. Chen, K. Sasaki, C. Ma, A. I. Frenkel, N. Marinkovic, J. T. Muckerman, Y. Zhu, R. R. Adzic, Angew. Chem. Int. Ed. 2012, 51, 6131; b) B. Cao, G. M. Veith, J. C. Neuefeind, R. R. Adzic, P. G. Khalifah, J. Am. Chem. Soc. 2013, 135, 19186.

[7] a) M. S. Faber, S. Jin, Energy Environ. Sci. 2014, 7, 3519; b) D. Kong, J. J. Cha, H. Wang, H. R. Lee, Y. Cui, Energy Environ. Sci. 2013, 6, 3553; c) H. S. Shin, J. Yang, J. Mater. Chem. A 2013, 2, 5979; d) G. Sun, J. Liu, X. Zhang, X. Wang, H. Li, Y. Yu, W. Huang, H. Zhang, P. Chen, Angew. Chem. Int. Ed. 2014, 53, 12576; e) Z. Huang, C. Lv, Z. Chen, Z. Chen, F. Tian, C. Zhang, Nano Energy 2015, In press; f) Z. Huang, Z. Chen, Z. Chen, C. Lv, H. Meng, C. Zhang, ACS Nano 2014, 8, 8121; g) J. Jiang, C. Wang, J. Zhang, W. Wang, X. Zhou, B. Pan, K. Tang, J. Zuo, Q. Yang, J. Mater. Chem. A 2015, 3, 499; h) J. Tian, Q. Liu, Y. Liang, Z. Xing, A. M. Asiri, X. Sun, ACS Applied Materials & Interfaces 2014, 6, 20579; i) P. Jiang, Q. Liu, Y. Liang, J. Tian, A. M. Asiri, X. Sun, Angew. Chem. Int. Ed. 2014, 53, 12855; j) J. F. Callejas, J. M. McEnaney, C. G. Read, J. C. Crompton, A. J. Biacchi, E. J. Popczun, T. R. Gordon, N. S. Lewis, R. E. Schaak, ACS Nano 2014, 8, 11101; k) R. Liu, S. Gu, H. Du, A. M. Asiri, C. Li, J. Mater. Chem. A 2014, 2, 17263; l) Z. Zhang, B. Lu, J. Hao, W. Yang, J. Tang, Chem. Commun. 2014, 50, 11554; m) Y. Xu, R. Wu, J. Zhang, Y. Shi, B. Zhang, Chem. Commun. 2013, 49, 6656; n) Q. Liu, J. Tian, W. Cui, P. Jiang, N. Cheng, A. M. Asiri, X. Sun, Angew. Chem. Int. Ed. 2014, 53, 6710; o) E. J. Popczun, C. G. Read, C. W. Roske, N. S. Lewis, R. E. Schaak, Angew. Chem. Int. Ed. 2014, 53, 5427; p) J. Tian, Q. Liu, A. M. Asiri, X. Sun, J. Am. Chem. Soc. 2014, 136, 7587; q) L. Feng, H. Vrubel, M. Bensimon, X. Hu, Physical Chemistry Chemical Physics 2014, 16, 5917; r) E. J. Popczun, J. R. McKone, C. G. Read, A. J. Biacchi, A. M. Wiltrout, N. S. Lewis, R. E. Schaak, J. Am. Chem. Soc. 2013, 135, 9267.

[8] K. Barbalace, Environmental Chemistry 1995-2015.

[9] C. L. Green, A. Kucernak, J. Phys. Chem. B 2002, 106, 1036.

[10] D. Voiry, H. Yamaguchi, J. Li, R. Silva, D. C. B. Alves, T. Fujita, M. Chen, T. Asefa, V. B. Shenoy, G. Eda, M. Chhowalla, Nat. Mater. 2013, 12, 850.

Supporting Materials for Example 1

TABLE S1

Summary of HER performance for Iron-based catalysts published recently. It is noted that particular attention should be paid when comparing the overpotential ($\eta_{10}$ and $\eta_{20}$) and exchange current density since they are strongly affected by the potential calibration for reference electrodes. The Ag/AgCl reference electrodes are used in reference [5] and [10], where the potential calibration equation is $E(RHE) = E(Ag/AgCl) + 0.197 + 0.059 \text{ pH}$. For example, the pH value for a 0.5M $H_2SO_4$ solution is around 0.35; hence the calibration equation becomes $E(RHE) = E(Ag/AgCl) + 0.218$. If a saturated calomel electrode (SCE) electrode is used the potential calibration is $E(RHE) = E(SCE) + 0.241 + 0.059 \text{ pH} = E(SCE) + 0.262$ (for pH = 0.35), which is used in references [7] and [14]. However, in references [2] [3] [4] and [13] the potential calibration was taken as $E(RHE) = E(SCE) + 0.281$, meaning that the values of $\eta_{10}$ and $\eta_{20}$ in these references are further lowered by 19 mV and the exchange current density value is expected to be higher due to the calibration.

| Catalyst | substrate | Catalyst loading (mg/cm$^2$) | $\eta_{10}$ (mV) | $\eta_{20}$ (mV) | Tafel slope (mV/dec) | $J_0$ (mA/cm$^2$) | Electrolyte Conc. ($H_2SO_4$) |
|---|---|---|---|---|---|---|---|
| FeP (this work) | Carbon cloth | 4.9 | 39 | 49 | 29.4 | 0.47 | 0.5M |
| FeP[1] | Ti foil | 1 | 50 | 61 | 37 | 0.43 | 0.5M |
| FeP[2] | Ti foil | 0.6 | 85 | | 60 | | 0.5M |
| FeP[3] | carbon cloth | 4.2 | | 54 | 32 | 0.59 | 0.5M |
| FeP[4] | Ti foil | 3.2 | 55 | 72 | 38 | 0.42 | 0.5M |
| FeP$_2$[5] | GCE | 0.425 | | | 66 | $1.75 \times 10^{-3}$ | 0.5M |
| porous FeP[6] | GCE | 0.28 | ~80 | ~110 | 67 | | 0.5M |
| FeP/Graphene[7] | GCE | 0.28 | 123 | | 50 | 0.12 | 0.5M |

TABLE S1-continued

Summary of HER performance for Iron-based catalysts published recently.
It is noted that particular attention should be paid when comparing the overpotential ($\eta_{10}$ and $\eta_{20}$) and exchange current density since they are strongly affected by the potential calibration for reference electrodes. The Ag/AgCl reference electrodes are used in reference [5] and [10], where the potential calibration equation is E(RHE) = E (Ag/AgCl) + 0.197 + 0.059 pH. For example, the pH value for a 0.5M $H_2SO_4$ solution is around 0.35; hence the calibration equation becomes E(RHE) = E(Ag/AgCl) + 0.218. If a saturated calomel electrode (SCE) electrode is used the potential calibration is E(RHE) = E(SCE) + 0.241 + 0.059 pH = E(SCE) + 0.262 (for pH = 0.35), which is used in references [7] and [14]. However, in references [2] [3] [4] and [13] the potential calibration was taken as E(RHE) = E(SCE) + 0.281, meaning that the values of $\eta_{10}$ and $\eta_{20}$ in these references are further lowered by 19 mV and the exchange current density value is expected to be higher due to the calibration.

| Catalyst | substrate | Catalyst loading (mg/cm$^2$) | $\eta_{10}$ (mV) | $\eta_{20}$ (mV) | Tafel slope (mV/dec) | $J_0$ (mA/cm$^2$) | Electrolyte Conc. ($H_2SO_4$) |
|---|---|---|---|---|---|---|---|
| Fe$_2$P/N-graphene[8] | GCE | 1.71 | 138 | 164 | 67 | 9.2 × 10$^{-2}$ | 0.5M |
| Ni$_2$P[9] | Ti foil | 1 | 117 | 130 | 46 | 3.3 × 10$^{-3}$ | 0.5M |
| Ni$_2$P[10] | GCE | 0.38 | | 140 | 87 | | 1.0M |
| CoP[11] | Ti foil | 2 | | 85 | 50 | | 0.5M |
| Ni$_{12}$P$_5$[12] | Ti foil | 3 | 107 | 141 | 63 | | 0.5M |
| CoP/CNT[13] | GCE | 0.285 | 122 | | 54 | 0.13 | 0.5M |
| CoP[14] | Carbon cloth | 0.92 | 67 | 100 | 51 | | 0.5M |

REFERENCES

[1] J. F. Callejas, J. M. McEnaney, C. G. Read, J. C. Crompton, A. J. Biacchi, E. J. Popczun, T. R. Gordon, N. S. Lewis, R. E. Schaak, ACS Nano 2014, 8, 11101.
[2] R. Liu, S. Gu, H. Du, A. M. Asiri, C. Li, J. Mater. Chem. A 2014, 2, 17263.
[3] J. Tian, Q. Liu, Y. Liang, Z. Xing, A. M. Asiri, X. Sun, ACS Applied Materials & Interfaces 2014, 6, 20579.
[4] P. Jiang, Q. Liu, Y. Liang, J. Tian, A. M. Asiri, X. Sun, Angew. Chem. Int. Ed. 2014, 53, 12855.
[5] J. Jiang, C. Wang, J. Zhang, W. Wang, X. Zhou, B. Pan, K. Tang, J. Zuo, Q. Yang, J. Mater. Chem. A 2015, 3, 499.
[6] Y. Xu, R. Wu, J. Zhang, Y. Shi, B. Zhang, Chem. Commun. 2013, 49, 6656.
[7] Z. Zhang, B. Lu, J. Hao, W. Yang, J. Tang, Chem. Commun. 2014, 50, 11554.
[8] Z. Huang, C. Lv, Z. Chen, Z. Chen, F. Tian, C. Zhang, Nano Energy 2015, In press.
[9] E. J. Popczun, J. R. McKone, C. G. Read, A. J. Biacchi, A. M. Wiltrout, N. S. Lewis, R. E. Schaak, J. Am. Chem. Soc. 2013, 135, 9267.
[10] L. Feng, H. Vrubel, M. Bensimon, X. Hu, Physical Chemistry Chemical Physics 2014, 16, 5917.
[11] E. J. Popczun, C. G. Read, C. W. Roske, N. S. Lewis, R. E. Schaak, Angew. Chem. Int. Ed. 2014, 53, 5427.
[12] Z. Huang, Z. Chen, Z. Chen, C. Lv, H. Meng, C. Zhang, ACS Nano 2014, 8, 8121.
[13] Q. Liu, J. Tian, W. Cui, P. Jiang, N. Cheng, A. M. Asiri, X. Sun, Angew. Chem. Int. Ed. 2014, 53, 6710.
[14] J. Tian, Q. Liu, A. M. Asiri, X. Sun, J. Am. Chem. Soc. 2014, 136, 7587.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "x" "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim at least the following:
1. A method of phosphidation, comprising:
electroplating of a metal (M) on a substrate using constant current electroplating conducting at a constant current density synthesize a M layer having rugae-like morphology,
converting the M to MOOH, and optionally converting the MOOH to M oxide, and
converting the MOOH, M oxide, or both to nanocrystalline metal phosphide (MP);
wherein M is Fe, and the converting M to MOOH step produces a FeOOH-coated substrate comprising both α-FeOOH and γ-FeOOH.
2. The method of claim 1, wherein the substrate is a carbon cloth.
3. The method of claim 1, wherein converting the MOOH, M oxide, or both to nanocrystalline MP includes a vapor phase phosphidation carried out in a two-zone chemical vapor deposition (CVD) furnace, wherein $PH_3$ vapor reacts with the MOOH, M oxide, or both at a temperature within a range of 250-400° C.
4. The method of claim 3, wherein the $PH_3$ vapor is produces by evaporating $NaH_2PO_2$ in a first zone of the two-zone CVD furnace.

5. The method of claim 3, wherein the $Ph_3$ vapor is brought to the FeOOH-coated substrate in the second zone of the two-zone CVD furnace, and wherein the second zone temperature is maintained within a range of 250-300° C.

* * * * *